United States Patent
Han et al.

(10) Patent No.: US 7,606,046 B2
(45) Date of Patent: Oct. 20, 2009

(54) SEMICONDUCTOR DEVICE AND METHOD FOR MITIGATING ELECTROSTATIC DISCHARGE (ESD)

(75) Inventors: Sang-Guk Han, Hwaseong-si (KR); Chan-Min Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 237 days.

(21) Appl. No.: 10/956,118

(22) Filed: Oct. 4, 2004

(65) Prior Publication Data

US 2005/0184313 A1 Aug. 25, 2005

(30) Foreign Application Priority Data

Feb. 24, 2004 (KR) .................... 10-2004-0012332

(51) Int. Cl.
*H05K 7/00* (2006.01)
(52) U.S. Cl. ..................................... 361/760
(58) Field of Classification Search ................ 361/760, 361/111, 56, 126, 794
See application file for complete search history.

(56) References Cited

U.S. PATENT DOCUMENTS

| | | | | |
|---|---|---|---|---|
| 5,552,951 | A * | 9/1996 | Pasch et al. ................ | 361/56 |
| 5,644,167 | A * | 7/1997 | Weiler et al. ............... | 257/777 |
| 5,796,570 | A * | 8/1998 | Mekdhanasarn et al. ..... | 361/126 |
| 5,889,308 | A * | 3/1999 | Hong et al. ................. | 257/355 |
| 6,064,094 | A * | 5/2000 | Intrater et al. .............. | 257/355 |
| 6,249,413 | B1 * | 6/2001 | Duvvury ..................... | 361/111 |
| 6,433,394 | B1 * | 8/2002 | Intrater ....................... | 357/355 |
| 2004/0095699 | A1 * | 5/2004 | Kohno ......................... | 361/100 |

FOREIGN PATENT DOCUMENTS

| | | |
|---|---|---|
| JP | 2000-049429 | 2/2000 |
| KR | 2001-0018947 | 3/2001 |
| KR | 2001-0018949 | 3/2001 |
| KR | 1020010018949 A | 3/2001 |

OTHER PUBLICATIONS

Korean Office Action.

* cited by examiner

*Primary Examiner*—Dean A. Reichard
*Assistant Examiner*—Abiy Getachew
(74) *Attorney, Agent, or Firm*—Harness, Dickey & Pierce, P.L.C.

(57) ABSTRACT

A semiconductor device including a PCB including conductive patterns formed on at least one surface of the PCB, external connection terminals including at least one ground terminal and coupled to the conductive patterns, at least one semiconductor chip mounted on a surface of the PCB, and an ESD protection pattern being coupled to at least one of the least one ground terminal, the at least one ground terminal not being coupled to the conductive patterns. A semiconductor memory device, including a PCB, a memory chip mounted on a first surface of the PCB, external connection terminals formed on a second surface of the PCB, and a first ESD protection pattern being coupled to at least one ground terminal. A method of mitigating ESD in a semiconductor device, including mounting a chip on a PCB, forming conductive patterns on the PCB, and forming at least one ESD protection pattern on the PCB, the ESD protection pattern being connected to a ground terminal and not being coupled to the conductive patterns.

20 Claims, 6 Drawing Sheets

SEMICONDUCTOR DEVICE AND METHOD FOR MITIGATING ELECTROSTATIC DISCHARGE (ESD)

This application claims the priority of Korean Patent Application No. 2004-12332 filed on Feb. 24, 2004, the disclosure of which is incorporated herein by reference in its entirety.

BACKGROUND OF THE INVENTION

1. Field of the Invention

The present invention relates generally to semiconductor devices and methods, and more particularly, to a semiconductor device having an electrostatic discharge (ESD) protection structure.

2. Description of the Related Art

When a semiconductor device is exposed to an electric field, an electric potential may exist between the semiconductor device and other devices. When the electric potential exceeds a given voltage, an electrostatic discharge (ESD) may occur. The ESD may flow into the semiconductor device, which may cause damage to the semiconductor device.

Figure 1:
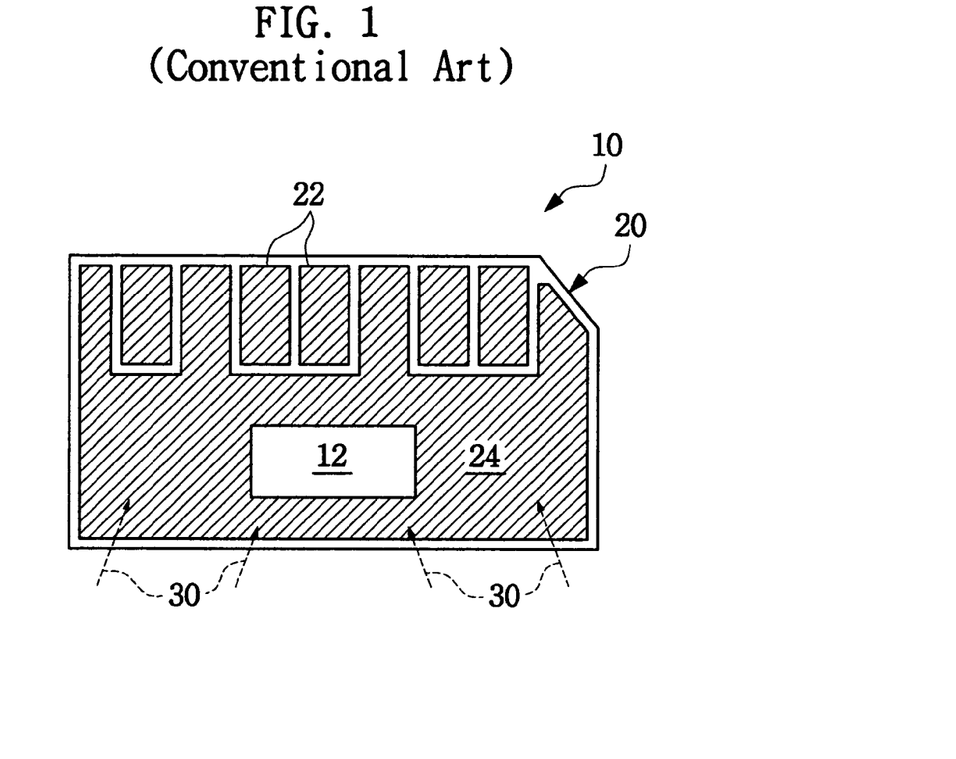
FIG. 1 illustrates a plan view of a Printed Circuit Board (PCB) according to conventional methods.

FIG. 1 illustrates a plan view of a Printed Circuit Board (PCB) according to conventional methods. As shown, PCB 20 may be packaged in a semiconductor package 10. The semiconductor package 10 may include a semiconductor chip 12 mounted on the PCB 20. The PCB 20 may include conductive patterns 24 and external connection terminals 22. The external connection terminals 22 may be formed along an edge of the PCB 20 and may be coupled to the conductive patterns 24.

The conductive patterns 24 may be formed close to the outer layer of the PCB 20 by conventional methods. The conductive patterns 24 may be conductive paths through which an ESD charge 30 may flow into the PCB 20, and the ESD charge 30 may further flow into the semiconductor chip 12, which may be mounted on the PCB 20. The conductive patterns 24 may not be formed in the outer layer of the PCB 20 in order to help prevent the ESD charge 30 from reaching the semiconductor chip 12. However, forming conductive patterns 24 away from the outer layer of the PCB 20 may cause various problems. These problems may include a decrease in mounting density, a warping of the PCB 20, and/or a reduction in heat dissipation.

By other conventional methods, passive, insulating devices with high impedance may be formed in the semiconductor package 10 and/or the PCB 20. However, this may increase the fabrication cost of the semiconductor package 10, increase fabrication complexity, reduce the yield of the semiconductor device, reduce the device mounting area, and/or decrease the mounting density.

SUMMARY OF THE INVENTION

An exemplary embodiment of the present invention is a semiconductor device including a printed circuit board (PCB) including conductive patterns formed on at least one surface of the PCB, external connection terminals, at least one of the external connection terminals being coupled to the conductive patterns, the external connection terminals including at least one ground terminal, and an electrostatic discharge (ESD) protection pattern being coupled to a first ground terminal of the at least one ground terminal, the at least one ground terminal not being coupled to the conductive patterns.

Another exemplary embodiment of the present invention is a semiconductor memory device, including a PCB including at least one of a signal layer, a power layer and a ground layer, a memory chip mounted on a first surface of the PCB, external connection terminals formed on a second surface of the PCB, and a first ESD protection pattern being coupled to at least one ground terminal.

Another exemplary embodiment of the present invention is a method of mitigating ESD in a semiconductor device, including forming a PCB for mounting a chip, mounting the chip on the PCB, forming conductive patterns on the PCB, and forming at least one ESD protection pattern on the PCB, the ESD protection pattern being connected to a ground terminal and not being coupled to the conductive patterns.

BRIEF DESCRIPTION OF THE DRAWINGS

The present invention will become more apparent by describing in detail exemplary embodiments thereof with reference to the attached drawings in which.

DETAILED DESCRIPTION OF THE EXEMPLARY EMBODIMENTS OF THE PRESENT INVENTION

Hereinafter, exemplary embodiments of the present invention will be described in detail with reference to the accompanying drawings.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

In the Figures, the same reference numerals are used to denote the same elements throughout the drawings.

Figure 2:
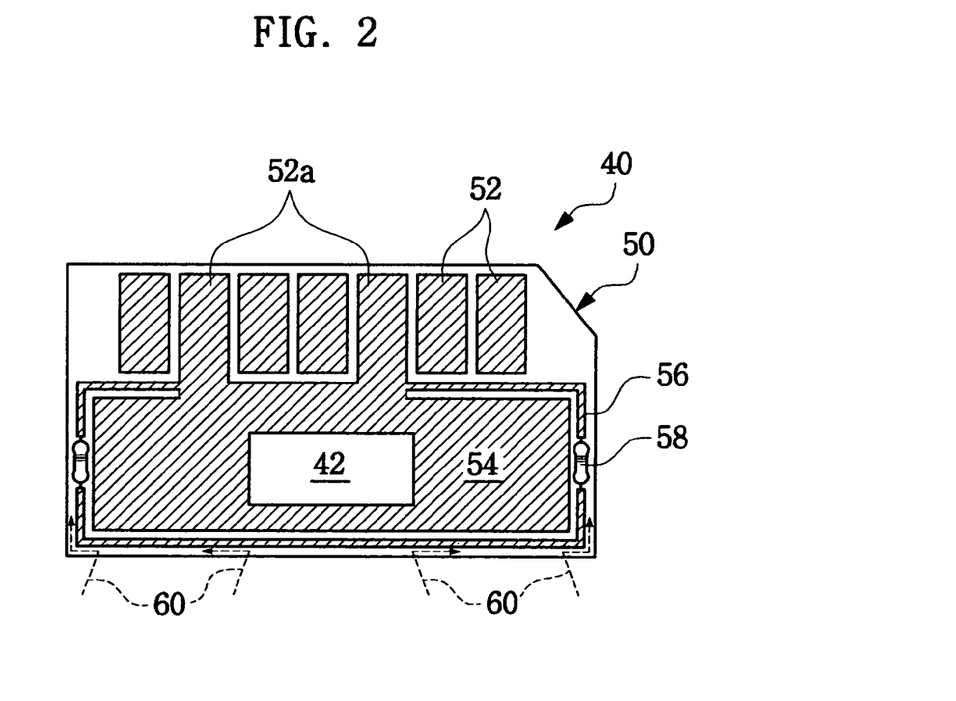
FIG. 2 illustrates a plan view of a PCB and a semiconductor package according to an exemplary embodiment of the present invention.

FIG. 2 illustrates a plan view of a Printed Circuit Board (PCB) 50 and a semiconductor package 40 according to an exemplary embodiment of the present invention.

In an exemplary embodiment of the present invention, referring to FIG. 2, the semiconductor package 40 may include the PCB 50. As shown, semiconductor chip 42 may be mounted on the PCB 50. The PCB 50 may include conductive patterns 54 and external connection terminals 52. The conductive patterns 54 may be formed on internal layers as well as both upper and lower outer layers of the PCB 50. The external connection terminals 52 may be formed on the upper outer layer of the PCB 50, as shown in FIG. 2. The external connection terminals 52 may also be formed alternatively on the lower outer layer of the PCB 50. The external connection terminals 52 may be formed along an edge of the PCB 50 and coupled to the conductive patterns 54. The semiconductor chip 42 may be electrically coupled to the conductive patterns 54, for example with wire bonding. The conductive patterns 54 may include signal connections, power connections and/or ground connections. The external connection terminals 52 may include signal terminals 52a, power terminals 52a and/or ground terminals 52a.

In another exemplary embodiment of the present invention, the PCB 50 may include an electrostatic discharge (ESD) protection pattern 56. The ESD protection pattern 56 may be formed along edges of the PCB 50. The ESD protection pattern 56 may surround the conductive patterns 54. The ESD protection patter 56 may further be formed apart from the conductive patterns 54, the ESD protection pattern 56 and the conductive patterns 54 not being electrically coupled. Furthermore, the ESD protection pattern 56 may be electrically coupled to the ground terminals 52a.

In another exemplary embodiment of the present invention, when an ESD charge 60 is received by the PCB 50, the ESD charge 60 may flow into the ESD protection pattern 56. The ESD protection pattern 56 may lead the flow of the ESD charge 60 into the ground terminals 52a. Therefore, the ESD protection pattern 56 may divert a path of the ESD charge 60 away from the conductive patterns 54, which may protect the semiconductor chip 42 from the ESD charge 60.

In another exemplary embodiment of the present invention, the ESD protection pattern 56 may have a non-linear form and/or a narrower width.

In another exemplary embodiment of the present invention, the ESD protection pattern 56 may include passive devices 58. Passive devices 58 may include resistors, and/or other electronic components which produce desirable characteristics in the ESD protection pattern 56.

In another exemplary embodiment of the present invention, the ESD protection pattern 56 may be formed during the same fabrication process and with the same material as the conductive patterns 54. Thus, the ESD protection pattern 56 may be fabricated during an existing process for forming the conductive patterns 54 without adding a new and separate step to the fabrication of the semiconductor device.

Figure 3:
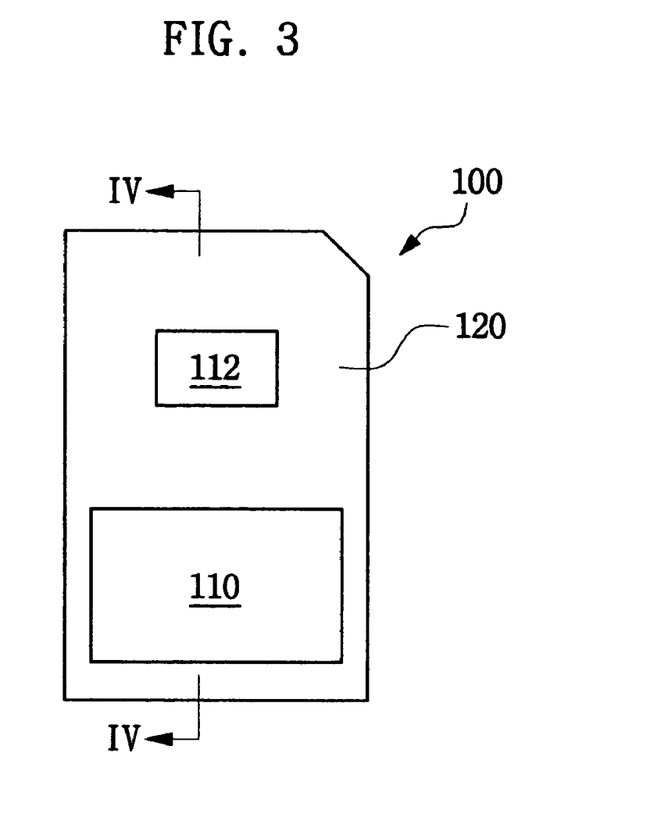
FIG. 3 illustrates a schematic plan view of a memory card according to another exemplary embodiment of the present invention.

FIG. 3 illustrates a schematic plan view of a memory card 100 according to another exemplary embodiment of the present invention.

Figure 4:
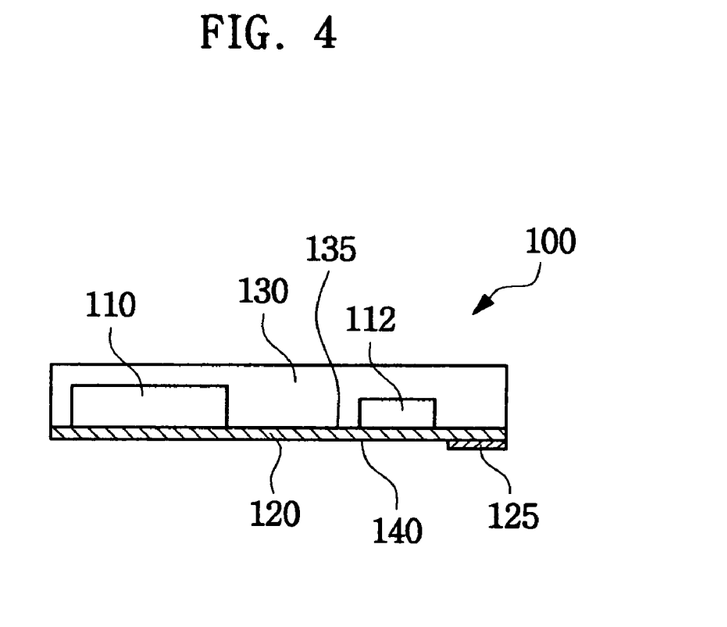
FIG. 4 illustrates a cross-sectional view of the memory card at the IV line of FIG. 3.

Similarly, FIG. 4 illustrates a cross-sectional view of the memory card 100 at the IV line of FIG. 3.

In an exemplary embodiment of the present invention, referring to both FIGS. 3 and 4, the memory card 100 may include a PCB 120 having upper outer layer 135 and lower outer layer 140. A memory chip 110 and a controller chip 112 may be mounted on the upper outer layer 135 of the PCB 120. An encapsulant 130 may be formed on the upper outer layer 135 of the PCB 120, which may cover the memory chip 110 and the controller chip 112. External connection terminals 125 may be formed on the lower outer layer 140 of the PCB 120.

Figure 5A:
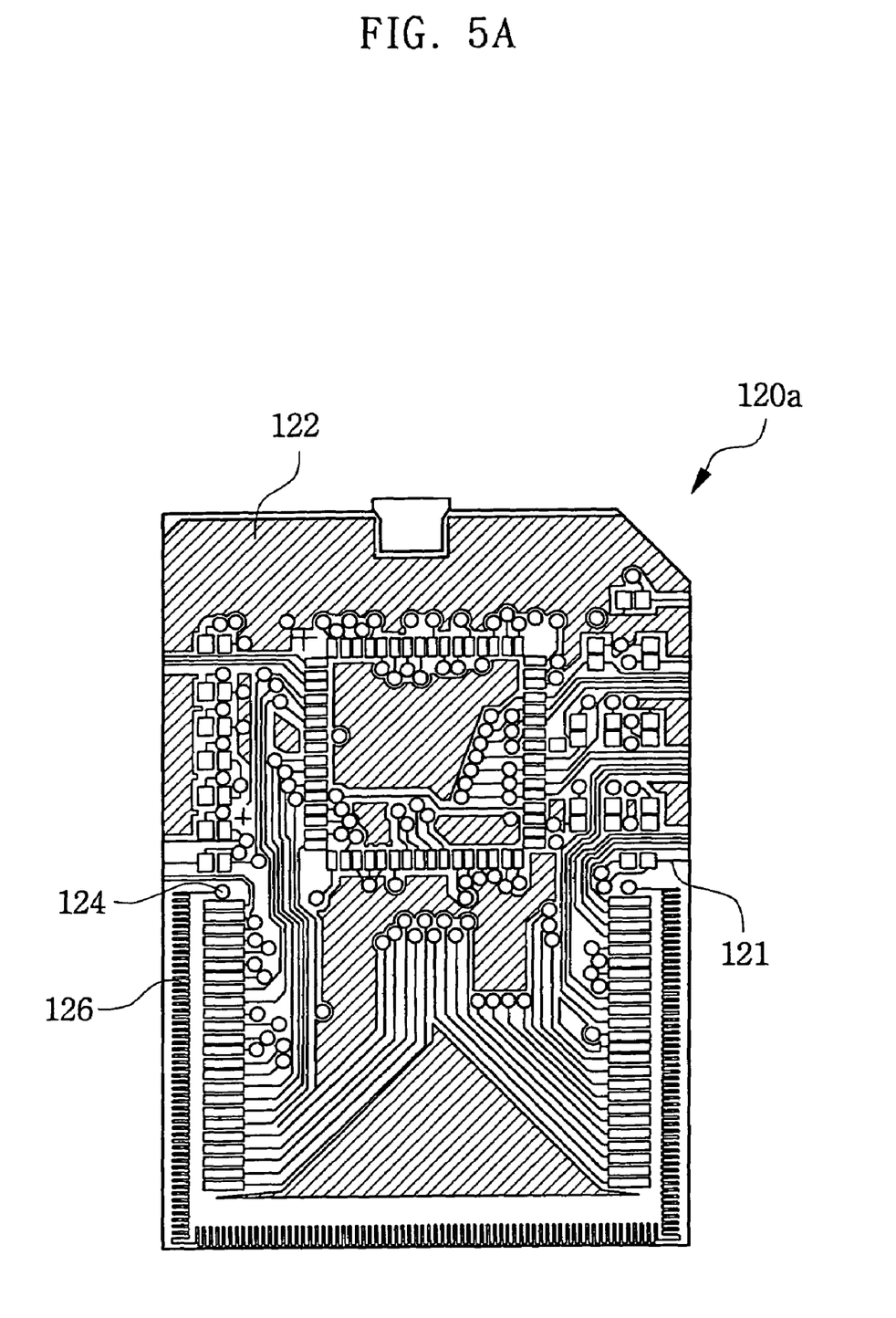
FIG. 5A illustrates a first signal layer 120a of the memory card of FIGS. 3 and 4 according to an exemplary embodiment of the present invention.

FIG. 5A illustrates a first signal layer 120a of the memory card 100 of FIGS. 3 and 4 according to an exemplary embodiment of the present invention.

Figure 5B:
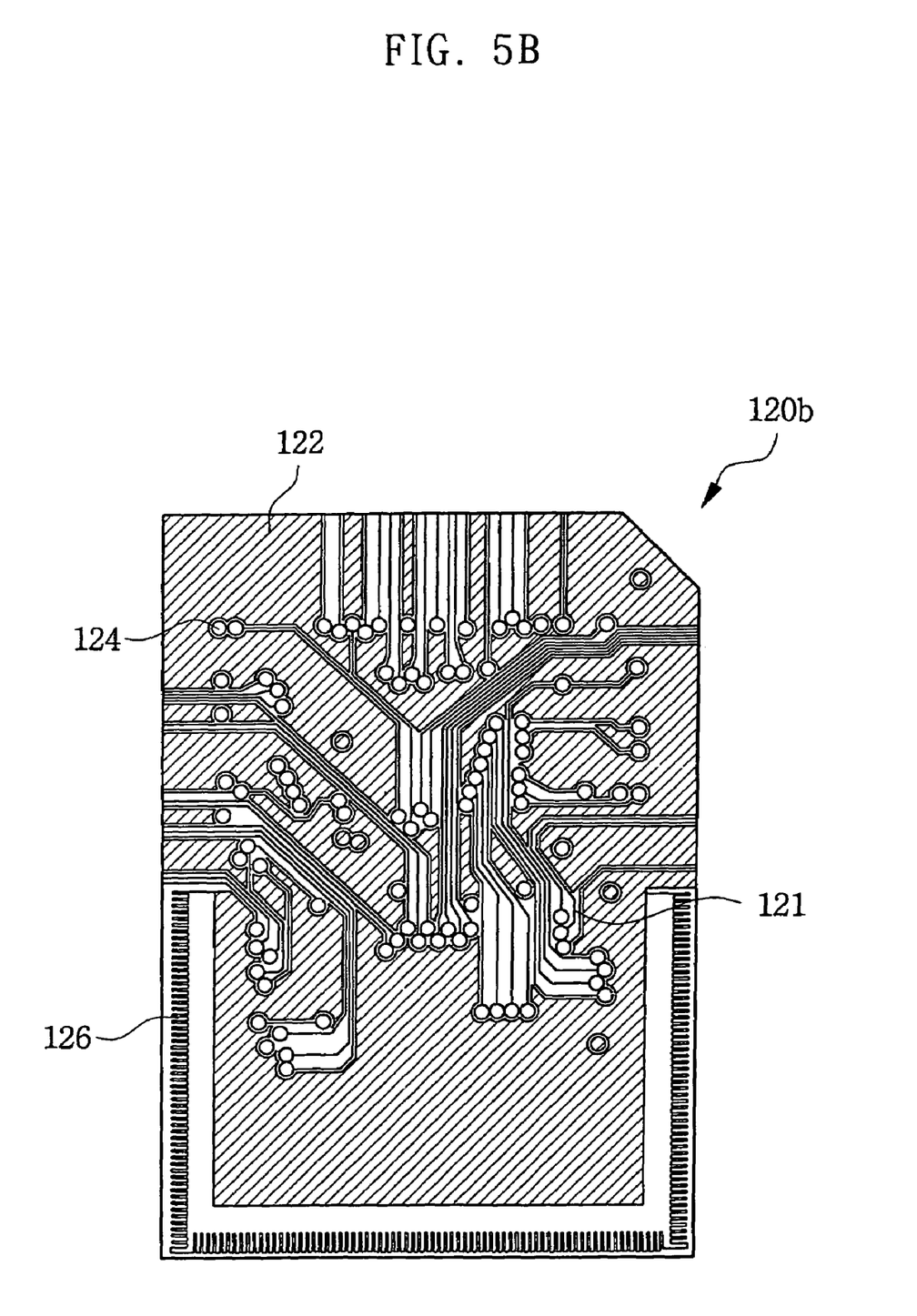
FIG. 5B illustrates a second signal layer 120b of the memory card of FIGS. 3 and 4 according to an exemplary embodiment of the present invention.

FIG. 5B illustrates a second signal layer 120b of the memory card 100 of FIGS. 3 and 4 according to an exemplary embodiment of the present invention.

Figure 5C:
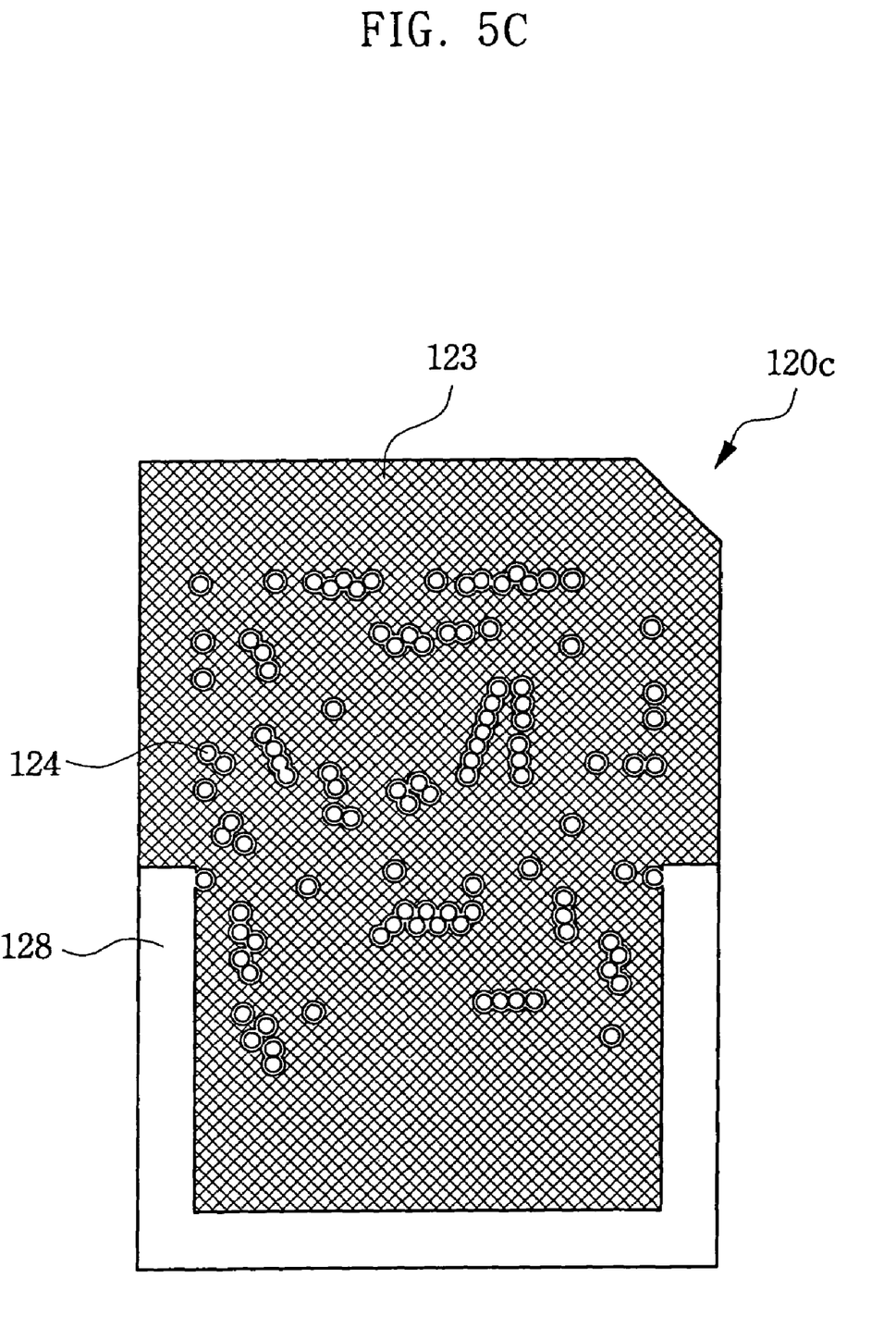
FIG. 5C illustrates a power layer 120c of the memory card of FIGS. 3 and 4 according to an exemplary embodiment of the present invention.

FIG. 5C illustrates a power layer 120c of the memory card 100 of FIGS. 3 and 4 according to an exemplary embodiment of the present invention.

Figure 5D:
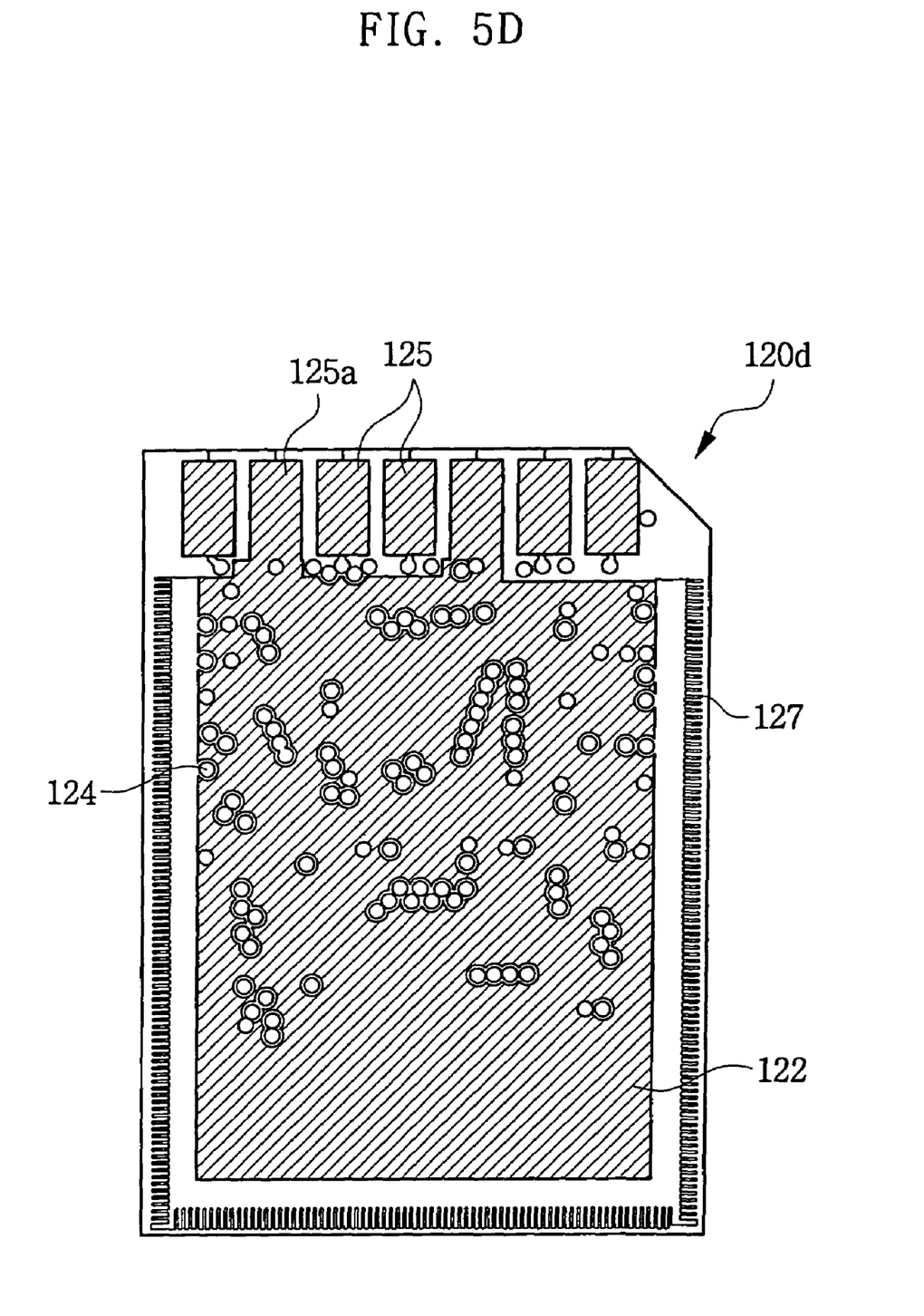
FIG. 5D illustrates a ground layer 120d of the memory card of FIGS. 3 and 4 according to an exemplary embodiment of the present invention.

FIG. 5D illustrates a ground layer 120d of the memory card 100 of FIGS. 3 and 4 according to an exemplary embodiment of the present invention.

In an exemplary embodiment of the present invention, the memory chip 110 may be a NAND-type flash memory device. The memory chip 110 may be mounted in a bare-chip form and/or a packaged form on the upper outer layer 135 of the PCB 120.

In another exemplary embodiment of the present invention, the memory chip 110 may be a NOR-type flash memory device.

In another exemplary embodiment of the present invention, referring to FIGS. 5A, 5B and 5D, a controller chip 122 may be a logic device that controls the operation of the memory card 100 and the memory chip 110. The controller chip 122 may be mounted in a bare-chip form and/or a packaged form on the upper outer layer 135 of the PCB 120.

In another exemplary embodiment of the present invention, if the memory chip 110 and controller chip 112 have bare-chip forms, the memory chip 110 and the controller chip 112 may be connected to the PCB 120 through any well-known technique, for example wire bonding.

In another exemplary embodiment of the present invention, if the memory chip 110 and the controller chip 112 have packaged forms, the memory chip 110 and the controller chip 112 connected to the PCB 120 through well-known technique, for example surface mounting.

In another exemplary embodiment of the present invention, the external connection terminals 125 may function as electrical paths between the memory card 100 and an electronic device (not shown). The external connection terminals 125 may include signal terminals, power terminals and ground terminals. The signal terminals may include data input/output (I/O) terminals, command signal terminals and/or clock signal terminals.

In another exemplary embodiment of the present invention, the encapsulant 130 may be a molding resin that is formed by well-known technique, for example a molding technique.

In another exemplary embodiment of the present invention, the encapsulant 130 may be a sealing cap that may be attached by an adhesive.

In another exemplary embodiment of the present invention, referring to FIGS. 5A and 5B, each signal layer 120a and 120b may have a signal pattern 121 and/or a ground plane 122. If the first signal layer 120a forms the upper outer layer 135 of the PCB 120, the signal pattern 121 of the first signal layer 120a may include connection pads that may be coupled to the memory chip 110 and/or the controller chip 112. The signal patterns 121 of the first signal layer 120 and the second signal layer 120b may be coupled to each other through via holes 124.

In another exemplary embodiment of the present invention, first signal layer 120a and second signal layer 120b may have a first ESD protection pattern 126 that may be formed along edges of the first signal layer 120a and/or the second signal layer 120*b*. The first ESD protection pattern 126 may surround the mounting area of the memory chip 110. The ESD protection pattern 126 may be formed apart from the signal pattern 121 and/or the ground plane 122, the ESD protection pattern 126 not being coupled to the signal pattern 121 and/or the ground plane 122. Referring to FIG. 5D, the ESD protection pattern 126 may be electrically coupled to the ground terminals 125*a* through the via hole 124.

In another exemplary embodiment of the present invention, referring to FIG. 5C, the power layer 120*c* may include a power plane 123. The power layer 120*c* may include no conductive pattern and/or no power plane in a peripheral portion 128, the peripheral region 128 corresponding to the first ESD protection pattern 126 of the first signal layer 120*a* and/or the second signal layer 120*b*.

In another exemplary embodiment of the present invention, referring to FIG. 5D, the ground layer 120*d* may include a ground plane 122. The ground layer 120*d* may include a second ESD protection pattern 127 that may be formed along edges of the ground layer 120*d*. The second ESD protection pattern 127 may surround the ground plane 122. The second ESD protection pattern 127 may be formed apart from the ground plane 122, the second ESD protection pattern 127 not being coupled to the ground plane 122.

In another exemplary embodiment of the present invention, if the ground layer 120*d* forms the lower outer layer 140 of the PCB 120, the ground layer 120*d* may include external connection terminals 125 which may include ground terminals 125*a*. The second ESD protection pattern 127 may be electrically coupled to the ground terminals 125*a* directly or through the ground plane 122.

In another exemplary embodiment of the present invention, the first ESD protection pattern 126 and/or the second ESD protection pattern 127 may provide an alternate path on which an ESD charge may flow, which may reduce damage to the memory chip 110 from the ESD.

In another exemplary embodiment of the present invention, the first ESD protection pattern 126 and the second ESD protection pattern 127 may have a non-linear form and/or a narrow width.

In another exemplary embodiment of the present invention, ESD received by a PCB may flow to a ground terminal through ESD protection patterns without flowing to conductive patterns. Thus, negative effects to the conductive patterns due to the ESD may be avoided.

In an exemplary embodiment of the present invention, ESD protection patterns may be applied in an already required fabrication process. Thus, no new fabrication process may be required in order to add ESD protection layers, which may maintain a yield of the semiconductor device.

In another exemplary embodiment of the present invention, the ESD protection patterns may be formed by edges of a PCB of the semiconductor device. Thus, the addition of ESD protection patterns may not affect the device-mounting area and/or the mounting density of the semiconductor device.

The exemplary embodiments of the present invention being thus described, it will be obvious that the same may be varied in many ways. For example, above exemplary embodiments of the present invention have been described in view of a memory card 100. However, exemplary embodiments of the present invention may be applied to any fabricated semiconductor device.

Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor device comprising:
   a printed circuit board (PCB) including conductive patterns formed on at least one surface of the PCB;
   external connection terminals, at least one of the external connection terminals being coupled to the conductive patterns, the external connection terminals including at least one ground terminal; and
   a conductive electrostatic discharge (ESD) protection pattern being coupled to a first ground terminal of the at least one ground terminal, wherein a portion of the conductive pattern forms a signal pattern not electrically contacting the at least one ground terminal and the ESD protection pattern,
   wherein the ESD protection pattern is disposed along edges of the surface of the PCB, the ESD protection pattern surrounding and being spaced apart from the conductive patterns, the external connection terminals being located outside of the area surrounded by the ESD protection pattern.

2. The semiconductor device of claim 1, wherein the conductive ESD protection pattern has a non-linear pattern.

3. The semiconductor device of claim 1, wherein the conductive ESD protection pattern comprises at least one passive device.

4. A semiconductor memory device, comprising:
   a memory chip mounted on a first surface of a printed circuit board (PCB);
   external connection terminals including at least one ground terminal formed on a second surface of the PCB;
   a first conductive electrostatic discharge (ESD) protection pattern being coupled to the at least one ground terminal; and
   a signal pattern forming a signal layer on the PCB, wherein the first conductive ESD protection pattern is not electrically contacting the signal pattern,
   wherein the first ESD protection pattern surrounds and is spaced apart from the signal pattern, the external connection terminals being located outside the area surrounded by the ESD protection pattern.

5. The semiconductor memory device of claim 4, wherein the first conductive ESD protection pattern is formed along at least one edge of the signal layer.

6. The semiconductor memory device of claim 4, further comprising a ground layer formed on the PCB.

7. The semiconductor memory device of claim 6, wherein the ground layer has a ground plane and a second conductive ESD protection pattern.

8. The semiconductor memory device of claim 7, wherein the second conductive ESD protection pattern is formed along edges of the ground layer surrounding the ground plane.

9. The semiconductor memory device of claim 7, wherein the second conductive ESD protection pattern is not coupled to the ground plane.

10. The semiconductor memory device of claim 7, wherein the second conductive ESD protection pattern is electrically coupled to the at least one ground terminal, the at least one ground terminal not being coupled with the ground plane.

11. The semiconductor memory device of claim 4, further comprising a power layer formed on the PCB.

12. The semiconductor memory device of claim 11, wherein the power layer further comprises a power plane.

13. The semiconductor memory device of claim 12, wherein the power plane is not formed on the first conductive ESD protection pattern of the signal layer.

14. The semiconductor memory device of claim 4, wherein the first conductive ESD protection pattern has a non-linear pattern.

15. The semiconductor memory device of claim 7, wherein the second conductive ESD protection pattern has a non-linear pattern.

16. The semiconductor memory device of claim 4, wherein the first conductive ESD protection pattern comprises at least one passive device.

17. The semiconductor memory device of claim 7, wherein the second conductive ESD protection pattern comprises at least one passive device.

18. The semiconductor memory device of claim 4, further comprising a controller chip mounted on the first surface of the PCB.

19. The semiconductor memory device of claim 4, further comprising an encapsulant formed on the first surface of the PCB.

20. The semiconductor memory device of claim 19, wherein the encapsulant is formed around the memory chip.

* * * * *